(12) United States Patent
Kitaguchi et al.

(10) Patent No.: US 6,240,620 B1
(45) Date of Patent: Jun. 5, 2001

(54) MAKING OF BISMUTH 2212 SUPERCONDUCTING WIRE OR TAPE

(75) Inventors: Hitoshi Kitaguchi; Hanping Miao; Hiroaki Kumakura; Kazumasa Togano, all of Ibaraki (JP)

(73) Assignee: National Research Institute for Metals, Ibaraki (JP)

(*) Notice: Subject to any disclaimer, the term of this patent is extended or adjusted under 35 U.S.C. 154(b) by 0 days.

(21) Appl. No.: 09/186,383

(22) Filed: Nov. 5, 1998

(30) Foreign Application Priority Data

Nov. 17, 1997 (JP) .................................................. 9-315240

(51) Int. Cl.[7] .................................................. H01L 39/24
(52) U.S. Cl. .............................. 29/599; 505/230; 505/232
(58) Field of Search ............................. 29/599; 505/230, 505/232

(56) References Cited

U.S. PATENT DOCUMENTS 5,811,376 * 9/1998 Huang.
5,874,384 * 2/1999 Balachandran.
6,028,036 * 2/2000 Tenbrink.

* cited by examiner

Primary Examiner—Timothy M. Speer
(74) Attorney, Agent, or Firm—Wenderoth, Lind & Ponack, L.L.P.

(57) ABSTRACT

In a process in which a composite consisting of a metallic base and a superconductor mainly containing a $Bi_2Sr_2CaCu_2O_x$ superconducting phase is formed into a composite wire or wire, the composite is subjected to calcination and cold working before heat treatment for crystallization from a partial molten state.

32 Claims, 2 Drawing Sheets

Remarks:

in #1 to 3, final heat treatment is different from each other

MAKING OF BISMUTH 2212 SUPERCONDUCTING WIRE OR TAPE

FIELD OF THE INVENTION

The present invention relates to making of bismuth 2212 superconducting wire or tape. More particularly, the present invention relates to a method of making a bismuth 2212 superconducting wire or tape, which is capable both of improving a critical current property of the bismuth 2212 superconducting wire or tape and of realizing high critical current density.

DESCRIPTION OF THE PRIOR ART

Making into a wire or tape has been studied for practical application of oxide superconductors. Several methods of making a tape have been provided, e.g., a doctor blade method, a dip-coating method, a coating method, and a silver-sheathed method. In every method, a composite wire consisting of an oxide superconductor and a metallic base made of silver is formed.

The making methods above-mentioned have been applied to a wire making process of a $Bi_2Sr_2CaCu_2O_x$ superconductor (hereinafter, bismuth 2212 ) and realization of high critical current density has been studied. In a making process of the bismuth 2212 superconducting tape to which the doctor blade method, dip-coating method, or coating method is applied, a thick film consisting of an organic solvent(s) and the bismuth 2212 superconductor is formed on a metallic base made of silver or a silver base alloy and an oriented structure is formed from a partial molten state after eliminating the organic substance(s) by heating the thick film.

Critical current density realized by any of the methods up to now is, however, no more than $10^5$ A/cm$^2$ by average current density in a magnetic field of 4.2 K and 10 T. Improvement of critical current density is inevitably demanded and hoped in order to widen practical application range of the bismuth 2212 superconducting wire or tape. The improvement will enable a system consisting of a magnet and a refrigerator to be used at higher temperature and also promote improvement of security and design variation as well as miniaturization of the system.

The present invention has an object to provide a new method of making a bismuth 2212 superconducting wire or tape, which aims to realize high current density for practical application of the bismuth 2212 superconducting wire or tape.

This and other objects, features and advantages of the invention will become more apparent upon a reading of the following detailed description and drawings.

EMBODIMENTS

Figure 1:
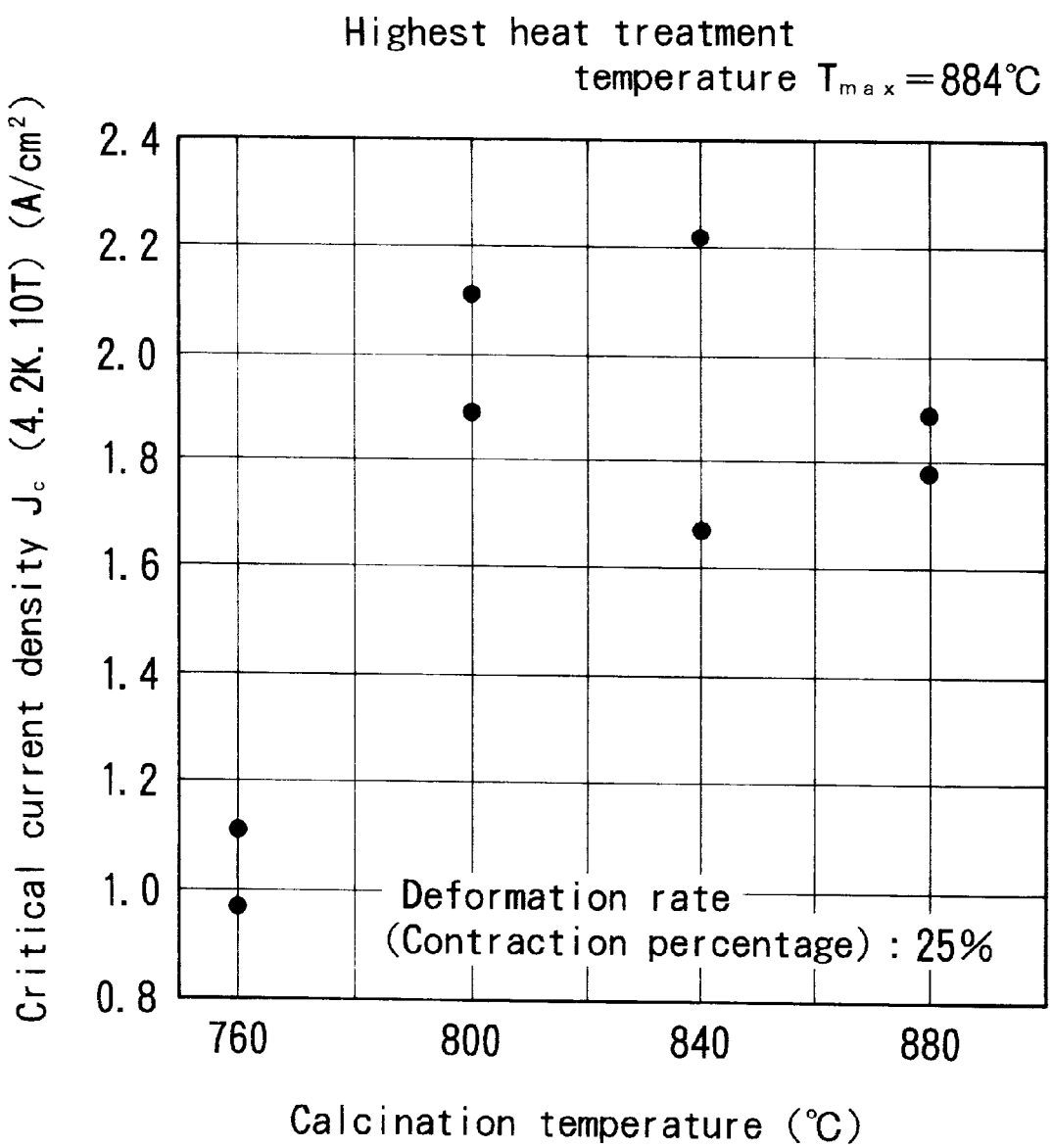
FIG. 1 is a graph showing a relationship between calcination temperature and critical current density at deformation rate of 25%.

The present invention provides a method of making a bismuth 2212 superconducting wire or tape for a process in which a composite consisting of a metallic base and a superconductor mainly containing a $Bi_2Sr_2CaCu_2O_x$ superconducting phase is formed into a composite wire or tape, comprising the step of subjecting the composite to calcination and cold-working before heat treatment for crystallization from a partial molten state.

In the present invention, a series of calcination and cold working are performed as pretreatment before a series of partial melting and heat treatment, which are efficient to achieve high critical current density, in a making process of a bismuth 2212 superconducting wire or tape. Critical current density of a bismuth 2212 superconducting wire or tape will be greatly improved by the calcination and cold working before those partial melting and heat treatment. Contribution to the improvement of a critical current property and a mechanism of a series of calcination and cold working have not been known, but it is estimated that density, degree of orientation, and electric coupling state between crystal grains in a composite wire or tape which consists of a bismuth 2212 superconductor and a metallic base are improved by a series of calcination and cold working, so that high critical density is realized.

Calcination is preferably performed in temperature range from 700 to 900° C. Improvement of critical current density is not remarkable under 700° C. and melting sometimes takes place of 900° C. Contraction percentage of cross-sectional planes in cold working is preferably more than 10%. Contribution to high critical density is not so great under 10%.

The calcination and cold working are possible to be repeated more than once, respectively. The sequence of calcination and cold working is arbitrary and is not limited.

A series of calcination and cold working are possible to be applied to the wire or tape making method above-mentioned.

The objective to which the calcination and cold working is, for example, a $Bi_2Sr_2CaCu_2O$ superconductor, or a composite such as the one which is made of a metallic base and a film consisting of an organic solvent(s) and materials from which a $Bi_2Sr_2CaCu_2O_x$ superconducting phase is produced by heat treatment, or a composite which is made by wrapping the composite of a metallic base and a film with a silver foil, in which both of the metallic base and film are wrapped by the silver foil. The objective is also a composite which is made of a tubular metallic base and $Bi_2Sr_2CaCu_2O_x$ superconductor or materials from which the $Bi_2Sr_2CaCu_2O_x$ superconducting phase is produced by heat treatment. In this composite, the $Bi_2Sr_2CaCu_2O_x$ superconductor or materials is (are) packed in the tubular metallic base, and the composite is deformed by working. In every composite, the metallic base is preferably made of silver or a silver base alloy.

According to the present invention, a critical current property of a bismuth 2212 superconducting wire or wire is improved and practical application range of the bismuth 2212 superconducting wire or tape will be widened.

Now, the present invention will be described in more detail by way of examples.

EXAMPLES

A thick film was formed on a silver foil by a dip coating method or a coating method from a mixture of a 2212 phase compound ($Bi_2Sr_2CaCu_2O_x$) and an organic solvent consisting of butanol, trichloroethylene and acrylic binders. The thick film was wrapped by another silver foil to be formed into a composite consisting of silver and the 2212 phase compound, the surface of which was made of silver. The composite was a starting material of a 2212 superconducting tape. With regard to a thick film formed by a coating method, three sheets of silver foil after coating were laminated and wrapped by another silver foil.

The starting material was calcined in pure oxygen gas flows (1 atm) at 700~900° C. for an hour, subsequently cooled to room temperature and subjected to plastic deformation as cold working. The plastic deformation working was performed by rolling and the number of rolling times was one. Deformation rate (contraction percentage) was in the range of 10~35%.

Specimens of the same starting materials, which were not subjected to calcination and cold working, were prepared for comparison.

Bismuth 2212 superconducting tapes were produced by a final heat treatment in pure oxygen gas flows (1 atm), up to the highest temperature, i.e., 888° C., as a series of partial melting and heat treatment.

Critical current of the 2212 superconducting tapes obtained was measured in a magnetic field of 4.2 K and 10 T by a D.C. four-probe method. Critical current of tapes to which a coating method was adopted was also measured in magnetic fields up to 4.2 K and 28 T. Critical current density was calculated by dividing critical current measured by cross-section of the oxide tape except silver or of the whole of the tape including silver.

Figure 2:
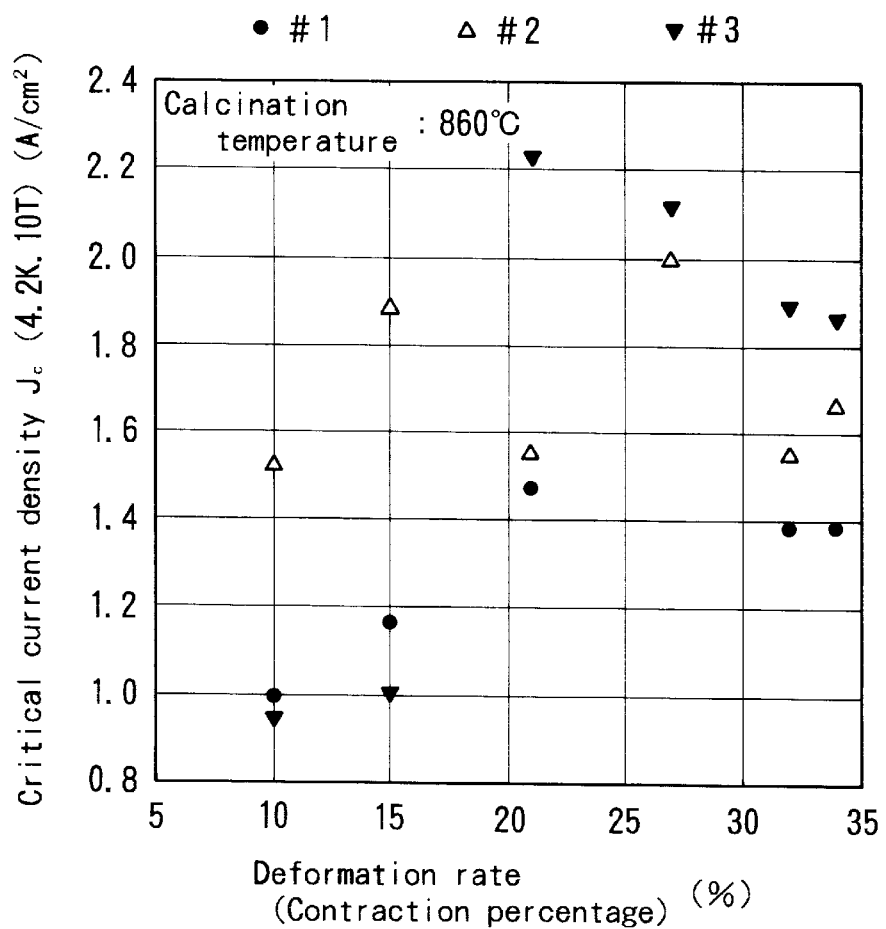
FIG. 2 is a graph showing a relationship between deformation rate, i.e., contraction percentage of cross-sectional planes, during cold working and critical current density at calcination temperature of 860° C.

FIGS. 1 and 2 are graphs showing relationships between critical current density and calcination temperature and between critical current density and deformation rate (contraction percentage) during plastic working, respectively.

High critical current density, i.e., critical current density $J_c$(4.2 K and 10 T) around $1.2 \times 10^5$ A/cm$^2$ was obtained from the oxide tape in every bismuth 2212 superconducting tape experienced calcination (860° C.) and cold working (deformation rate of 10~35%). On the other hand, low critical current density, i.e., critical current density $J_c$ (4.2 K and 10 T) of $0.8 \times 10^5$ A/cm$^2$ was obtained from the bismuth 2212 superconducting tapes not experienced calcination and cold working.

With regard to the tapes to which a coating method was adopted, high critical current density, i.e., critical current density $J_c$(4.2 K and 10 T) of 380~500 A/mm$^2$ and critical current density $J_c$ (a strong magnetic field of 4.2 K and 28 T) of 300 A/mm$^2$, was obtained from the tapes experienced calcination and cold working. On the other hand, low critical current density, i.e., critical current density $J_c$ (4.2 K and 10 T) of 160~200 A/mm$^2$ was obtained from the tape not experiences calcination and cold working.

The present invention is not limited to the embodiments. Various modifications will be possible.

What is claimed is:

1. A method of making a bismuth 2212 superconducting wire or tape for a process in which a composite of a metallic base and a superconductor mainly containing a $Bi_2Sr_2CaCu_2O_x$ superconducting phase is formed into a composite wire or tape, comprising the step of subjecting the composite to calcination and cold working before heat treatment for crystallization from a partial molten state.

2. The method as claimed in claim 1, wherein the calcination is performed in temperature range from 700 to 900° C.

3. The method as claimed in claim 1, wherein contraction percentage of cross-sectional planes in the cold working is more than 10%.

4. The method as claimed in claim 2, wherein contraction percentage of cross-sectional planes in the cold working is more than 10%.

5. The method as claimed in claim 1, wherein the composite is made of the metallic base and a film formed on the metallic base, the film consisting of an organic substance(s) and a $Bi_2Sr_2CaCu_2O_x$ superconductor or materials from which the $Bi_2Sr_2CaCu_2O_x$ superconducting phase is produced by heat treatment.

6. The method as claimed in claim 2, wherein the composite is made of the metallic base and a film formed on the metallic base, the film consisting of an organic substance(s) and a $Bi_2Sr_2CaCu_2O_x$ superconductor or materials from which the $Bi_2Sr_2CaCu_2O_x$ superconducting phase is produced by heat treatment.

7. The method as claimed in claim 3, wherein the composite is made of the metallic base and a film formed on the metallic base, the film consisting of an organic substance(s) and a $Bi_2Sr_2CaCu_2O_x$ superconducting phase is produced by heat treatment.

8. The method as claimed in claim 4, wherein the composite is made of the metallic base and a film formed on the metallic base, the film consisting of an organic substance(s) and a $Bi_2Sr_2CaCu_2O_x$ superconductor or materials from which the $Bi_2Sr_2CaCu_2O_x$ superconducting phase is produced by heat treatment.

9. The method as claimed in claim 5, wherein both of the metallic base and film are wrapped by a silver foil.

10. The method as claimed in claim 6, wherein both of the metallic base and film are wrapped in silver foil.

11. The method as claimed in claim 7, wherein both of the metallic base and film are wrapped by a silver foil.

12. The method as claimed in claim 8, wherein both of the metallic base and film are wrapped by a silver foil.

13. The method as claimed in claim 1, wherein the composite is made of a tubular metallic base and a $Bi_2Sr_2CaCu_2O_x$ superconductor or materials from which the $Bi_2Sr_2CaCu_2O_x$ superconducting phase is produced by heat treatment, the $Bi_2Sr_2CaCu_2O_x$ superconductor or materials being packed in the tubular metallic base, and the composite is deformed by working.

14. The method as claimed in claim 2, wherein the composite is made of a tubular metallic base and a $Bi_2Sr_2CaCu_2O_x$ superconductor or materials from which the $Bi_2Sr_2CaCu_2O_x$ superconducting phase is produced by heat treatment, the $Bi_2Sr_2CaCu_2O_x$ superconductor or materials being packed in the tubular metallic base, and the composite is deformed by working.

15. The method as claimed in claim 3, wherein the composite is made of a tubular metallic base and a $Bi_2Sr_2CaCu_2O_x$ superconductor or materials from which the $Bi_2Sr_2CaCu_2O_x$ superconducting phase is produced by heat treatment, the $Bi_2Sr_2CaCu_2O_x$ superconductor or materials being packed in the tubular metallic base, and the composite is deformed by working.

16. The method as claimed in claim 4, wherein the composite is made of a tubular metallic base and a $Bi_2Sr_2CaCu_2O_x$ superconductor or materials from which the $Bi_2Sr_2CaCu_2O_x$ superconductor phase is produced by heat treatment, the $Bi_2Sr_2CaCu_2O_x$ superconductor or materials being packed in the tubular metallic base, and the composite is deformed by working.

17. The method as claimed in claim 1, wherein the metallic base is made of silver or a silver base alloy.

18. The method as claimed in claim 2, wherein the metallic base is made of silver or a silver base alloy.

19. The method as claimed in claim 3, wherein the metallic base is made of silver or a silver base alloy.

20. The method as claimed in claim 4, wherein the metallic base is made of silver or a silver base alloy.

21. The method as claimed in claim 5, wherein the metallic base is made of silver or a silver base alloy.

22. The method as claimed in claim 6, wherein the metallic base is made of silver or a silver base alloy.

23. The method as claimed in claim 7, wherein the metallic base is made of silver or a silver base alloy.

24. The method as claimed in claim 8, wherein the metallic base is made of silver or a silver base alloy.

25. The method as claimed in claim 9, wherein the metallic base is made of silver or a silver base alloy.

26. The method as claimed in claim 10, wherein the metallic base is made of silver or a silver base alloy.

27. The method as claimed in claim 11, wherein the metallic base is made of silver or a silver base alloy.

28. The method as claimed in claim 12, wherein the metallic base is made of silver or a silver base alloy.

29. The method as claimed in claim 13, wherein the metallic base is made of silver or a silver base alloy.

30. The method as claimed in claim 14, wherein the metallic base is made of silver or a silver base alloy.

31. The method as claimed in claim 15, wherein the metallic base is made of silver or a silver base alloy.

32. The method as claimed in claim 16, wherein the metallic base is made of silver or a silver base alloy.

* * * * *